United States Patent
Huignard et al.

[11] 3,980,389
[45] Sept. 14, 1976

[54] ELECTRO-OPTICAL DEFLECTION APPARATUS USING HOLOGRAPHIC GRATING

[75] Inventors: Jean Pierre Huignard; Anne-Marie Roy; Christian Slezak, all of Paris, France

[73] Assignee: Thomson-CSF, Paris, France

[22] Filed: Dec. 12, 1974

[21] Appl. No.: 531,966

[30] Foreign Application Priority Data
Dec. 14, 1973  France .............. 73.44803

[52] U.S. Cl. ................... 350/3.5; 350/7; 350/162 R
[51] Int. Cl.² ................ G02B 5/32; G02F 1/33
[58] Field of Search ........ 350/3.5, 162 R, 161, 350/6, 7

[56] References Cited
UNITED STATES PATENTS

| | | | |
|---|---|---|---|
| 3,586,412 | 6/1971 | Leith | 350/3.5 |
| 3,630,594 | 12/1971 | Gorog | 350/3.5 |
| 3,677,622 | 7/1972 | Nishida et al. | 350/3.5 |
| 3,831,035 | 8/1974 | Hill | 350/3.5 |
| 3,874,785 | 4/1975 | Huignard | 350/3.5 |

*Primary Examiner*—Ronald J. Stern
*Attorney, Agent, or Firm*—Edwin E. Greigg

[57] ABSTRACT

An apparatus for deflecting beams of radiated energy, for example, laser beams, includes a primary deflector capable of deviating the incident beams into a plurality of directions, e.g., under the control of an electric field or by other means. In order to amplify the angular deflection so obtained, a set of essentially parallel diffraction gratings intercepts the deviated beams. The grating parameters are so chosen that each of the incident beams, arriving at slightly different incident angles, is diffracted by at least one grating in the set of diffraction gratings. Since the diffraction angle is substantially larger than the incident angle, an effective amplification of the angular deflection results.

The apparatus is adaptable to deflection in a plane and may be used for storing information in holograms.

8 Claims, 4 Drawing Figures

ELECTRO-OPTICAL DEFLECTION APPARATUS USING HOLOGRAPHIC GRATING

BACKGROUND OF THE INVENTION

The present invention relates to the deflection of radiated energy and more particularly to an electro-optical light deflection apparatus.

A deflector of this kind may be of the digital type, i.e., it may be capable of deflecting a beam of incident radiated energy into one of a certain finite number of predetermined directions or it may be of the analog type, i.e., it may be capable of deflecting the incident beam in a direction which depends on the magnitude of an applied electrical signal. As an example, the active element in such a deflector may be made of a so-called electro-optical material, i.e., a material whose index of refraction can be changed by the action of an electric field; by shaping this material in an appropriate way, the direction of the emerging ray may be made a function of the applied electric field.

Also belonging in this class are so-called electro-acoustical deflectors, customarily consisting of a solid or liquid substance in which plane ultrasonic waves are created by means of an electrical potential and these waves cause diffraction of an incident luminous beam into a specified direction which is a function, particularly, of the applied electric potential.

In general, this type of deflector has the inherent inconvenience of permitting only a small angular deviation.

OBJECT AND SUMMARY OF THE INVENTION

It is a principal object of the invention to provide a deflection system for a beam of radiated energy which avoids the inconvenience inherent in a known electro-optical deflector and which furnishes N predetermined directions of deviation. This object is attained, according to the invention, by providing N holographic diffraction gratings so constructed and disposed that each of the gratings diffracts into only one of the N directions. Therefore, each of the separately deviated beams emerging from the electro-optic deviator is thus amplified by selective diffraction in one of the gratings in the apparatus.

The invention will be better understood as well as further objects and advantages become more apparent from the ensuing detailed specification of preferred although exemplary embodiments taken in conjunction with the drawing.

DESCRIPTION OF THE PREFERRED EMBODIMENTS

Figure 1:
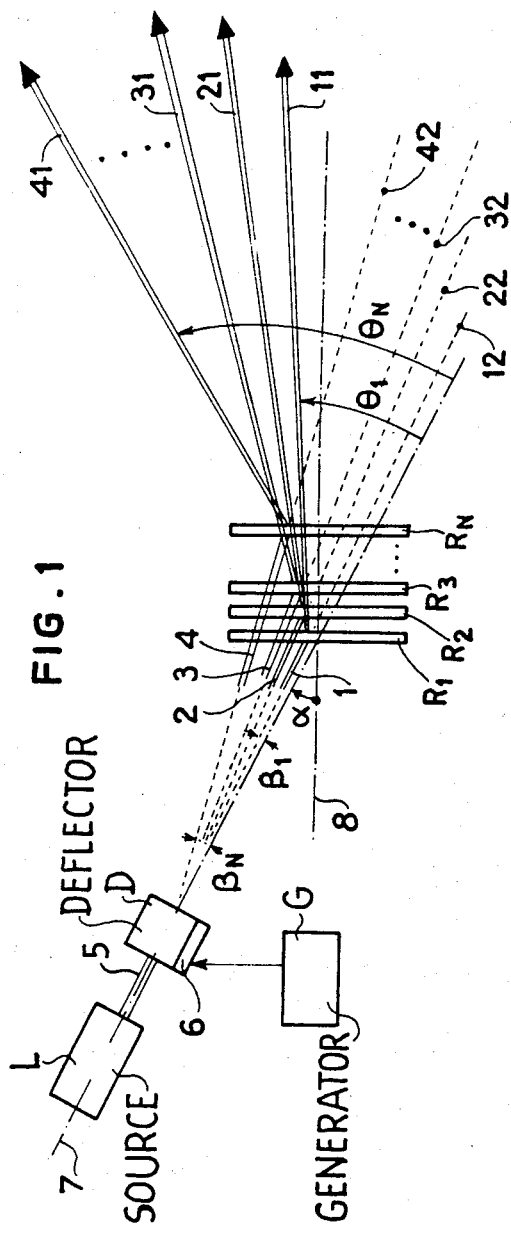
FIG. 1 is a schematic drawing of a side view of the apparatus according to the invention.

The embodiment shown in FIG. 1 includes a source L producing a beam 5 of radiated energy; an electro-optical deviator D which deflects the beam 5 into one of N directions; and N diffraction gratings $R_1, R_2, R_3 \ldots R_N$. By way of example, the source L, the beam 5 and the deviator D have been shown to lie along the same optical axis 7 which makes a finite angle $\alpha$ with the common perpendicular 8 to the plane of the mutually parallel diffraction gratings $R_1 \ldots R_N$. The source L may be a laser, emitting a parallel and coherent light beam 5.

For example, the electro-optical deflector D described in this embodiment may be of the acousto-optical type. It should be noted that such deflectors have the advantage, by comparison with other electro-optical devices, of permitting the deflection of an incident beam along one of a great number of distinct directions and that this is possible with very short access times. But they have the inconvenience that the maximum angle of deflection is quite small.

The deviator D is connected to a generator G producing periodic electrical signals at frequency $F_G$ by means of a piezo-electric transducer 6. The deviator D itself may employ a liquid or solid such as lead molybdate. As is known, the ultrasonic waves of wavelength $\lambda_G$ produced by the generator G in the element D, and acting through the transducer 6, have the effect of creating a diffraction grating; the pitch or grating spacing being $\rho = \lambda_G$. This grating diffracts an incident beam 5 into a direction making an angle $\beta$ with the axis 7. The angle $\beta$ is a function of $\lambda_G$ and of the wave length $\lambda$ of the incident beam 5.

For added clarity, only the first three directions of deviation ($\beta_1, \beta_2, \beta_3$) and the last direction ($\beta_N$) have been shown in the figure with greatly exaggerated angular amplitude. It is, of course, possible to obtain a much larger number of deflection angles $\beta$ by varying the frequency $F_G$ discretely. The emergent beams which correspond to these deviations $\beta_1, \beta_2, \beta_3 \ldots \beta_N$ are labeled 1, 2, 3 and 4 respectively. Furthermore, the beams emerging from the deviator D are indicated only by their axes, shown in broken lines.

The beams 1, 2, 3 and 4 encounter an assembly of N diffraction gratings, disposed mutually parallel in this exemplary embodiment, of which only the first three ($R_1, R_2, R_3$) and the last one ($R_N$) have been shown. Each of these gratings, which are preferably made by holographic recording, is so constituted and disposed, as will be described in more detail below, that at least one of the incident beams is diffracted by a particular grating. In the example shown, beam 1 corresponds to the direction $\beta_1$ which, itself, corresponds only to the grating $R_1$; hence the beam 1 is diffracted at an angle E given by the classical grating formula: $\sin E = \lambda/p_1$ where $p_1$ is the pitch of the grating $R_1$. If all angles are referred to the axis 7, the emergent beam 11 makes an angle $\theta_1$ with the axis 7 and one obtains $\sin (\theta_1 - \beta_1) = \lambda/p_1$. In the same way, beam 2 is diffracted only by grating 2 whose grating constant is $p_2$ resulting in a diffraction angle $\theta_2$, etc., and the last beam 4 is diffracted by the grating $R_N$ at an angle $\theta_N$.

So, N gratings selectively diffracting the incident directions $\beta$, produces an angular amplification. However, it is possible only if the various relevant parameters are chosen in such a manner that each grating selectively diffracts one of the incident beams, i.e., in the example shown, the grating $R_1$ diffracts only the beam 1, the grating $R_2$ only the beam 2, etc.

The considerations which are relevant in making the proper choice of these parameters are described below with reference to FIG. 2, which is an enlarged picture of only two of the above-mentioned diffraction gratings, namely $R_1$, and $R_2$, and of the corresponding beam directions 1 and 2 which are shown to emanate from a source S, shown schematically.

It is known that a holographic diffraction grating of refractive index $n$, thickness $e$ and grating pitch $p$ furnishes a reconstituted wave whose intensity varies with the direction of the incident beam: if $dr$ is used to designate the angular spread between two directions of the reconstituted wave, the first direction corresponding to a maximum and the second direction corresponding to a first zero of that intensity, one obtains the expression for the angular selection law of the grating: $dr = n\,p/e$. The angle $dr$ has been shown in FIG. 2 for beam 1 and illustrates the permissible tolerance in the direction of $\beta_1$ so as to obtain a diffraction angle $\theta_1$ for beam 1.

Holographic diffraction gratings of this kind can be recorded on photo-sensitive material of known type, for example on sensitized polymethyl methacrylate such as described, for example, in French Pat. No. 2,147,464. With such material it is possible to obtain a diffraction efficiency of the order of 80 %.

Figure 2:
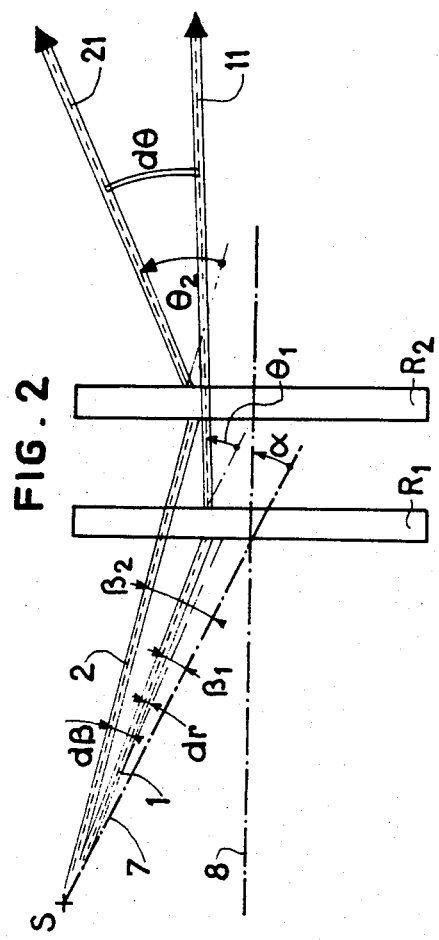
FIG. 2 is a more detailed representation of a portion of FIG. 1.

FIG. 2 also shows beam 2 diffracted by grating $R_2$ in the direction $\theta_2$ as measured from the axis 7, and one recalls that this angle is given by $\sin(\theta_2 - \beta_2) = \lambda/p_2$ (1)
where $p_2$ is the pitch of the grating $R_2$. The directions $\beta_1$ and $\beta_2$ differ from one another by an angle $d\beta$ which must be greater than the tolerance angle $dr$, as defined above, in order that the direction $\beta_2$ is not diffracted by the grating $R_1$ (as being out of the tolerance $dr$), and likewise the direction $\beta_1$ is not diffracted by the grating $R_2$.

As shown in the figure, the pitches of the gratings are so chosen that the angular difference $d\theta$ between emerging beams is much greater than $d\beta$.

In a particular embodiment, the various gratings have identical thickness and are disposed parallel to another and very close to each other. In a variant of construction which is not shown, one may use N gratings which are no longer parallel but instead make a finite angle resulting in $d\theta > d\beta$.

It should be noted that, in the figures, the angles $\theta$ are drawn with reference to the axis 7 and that they increase in the same sense as the angles $\beta$; of course, another choice of the parameters of the gratings R would make it possible, for example, to obtain angles $\theta_1 \ldots \theta_N$ whose values decreased for increasing values of the angles $\beta_1 \ldots \beta_N$.

Since the gratings $R_1$ to $R_N$ have a diffraction efficiency lower than 100%, the undiffracted beams form a useless luminous background and are shown in the figure by broken-line axes 12, 22, 32 and 42. These beams may be eliminated by an opaque screen interposed in their path behind the gratings as shown in one of the embodiments below, or, as shown in FIG. 1, by inclining the gratings (axis 8) with respect to the axis 7 of the incident beam by an angle $\alpha$.

It has been recalled above that an acousto-optical deflector makes possible a great number of distinct directions $\beta$, but with very small angular amplitude; i.e., to say, if one assumes that $\beta_N$ is the maximum angle of deviation, then $\beta_N$ is very small.

Classically, the maximum deviation angle $\beta_N$ is given by:

$$\beta_N = \lambda/v \cdot \Delta F_G \qquad (2)$$

where $\lambda$ is the wave length of the incident beam 5, $\Delta F_G$ is the frequency band applied to the deviator D and $v$ is the speed of propagation of the acoustical wave in the deviator D. In general, the order of magnitude obtained for $\beta_N$ is a few degrees.

The maximum number N of distinct directions $\beta$ is found by assuming that the smallest deflection angle is limited by diffraction and one then obtains $N = \Delta F_G \cdot d/v$ where $d$ is the diameter of the incident beam 5.

By way of example, it has been found in a system built according to the invention, that with a deviator wherein the speed of propagation $v$ was 3600 meters per second and wherein $\Delta F_G$ was 150 MHz, while using an incident beam 5 of wave length $\lambda = 0.5$ micron and diameter $d = 5$ mm, the maximum angle of deviation $\beta_N$ was approximately 1.2° and the maximum number N was 200. If one takes 10 distinct directions $\beta_1, \beta_2 \ldots \beta_{10}$, one has $d\beta = \beta_N/10 \simeq 2.1 \times 10^{-3}$ rad Using the expression for $dr$ given above:

$$dr \simeq n\,p/e \qquad (3)$$

one obtains the value of the parameters for the gratings $R_1 \ldots R_{10}$:

The thickness $e$ was made equal to 750 microns; for an index of refraction $n = 1.5$ and a pitch $p = 1\mu$, $dr = d\beta = 2.1 \times 10^{-3}$ rad. Thus, one obtains an angle $d\theta$ of the order of 3° and an angle $\theta_{10}$ of the order of 30°.

Thus, this system makes it possible to obtain a large amplification of the angular deviation from the acousto-optic deviator D. This amplification may, of course, be increased even further by disposing two or more identical gratings R in series, both corresponding to one of the individual incident directions $\beta$.

Such an arrangement would be limited only by the energetic efficiency of the assembly.

In order to improve this efficiency, one could, in particular, reduce the reflection losses at both surfaces of each of the $N - 1$ passive gratings, i.e., those gratings which do not cause any diffraction for a particular given direction $\beta$; the reflection losses at these surfaces are, in general, not negligible.

For this purpose, the N gratings, which are practically positioned face to face, are immersed in a liquid with the same index of refraction as the grating substrate material. This also brings the advantage of better angular selection of the gratings R, since $dr$ is proportional to the index of refraction n of the grating R with respect to the medium (air) which, in this case, is made equal to 1. In another embodiment, not shown, the N individual gratings are replaced by a single, thick hologram in which the N gratings are recorded separately. Such an element may be constructed using a ferro-electric crystal, for example, a crystal of lithium niobate.

Figure 3:
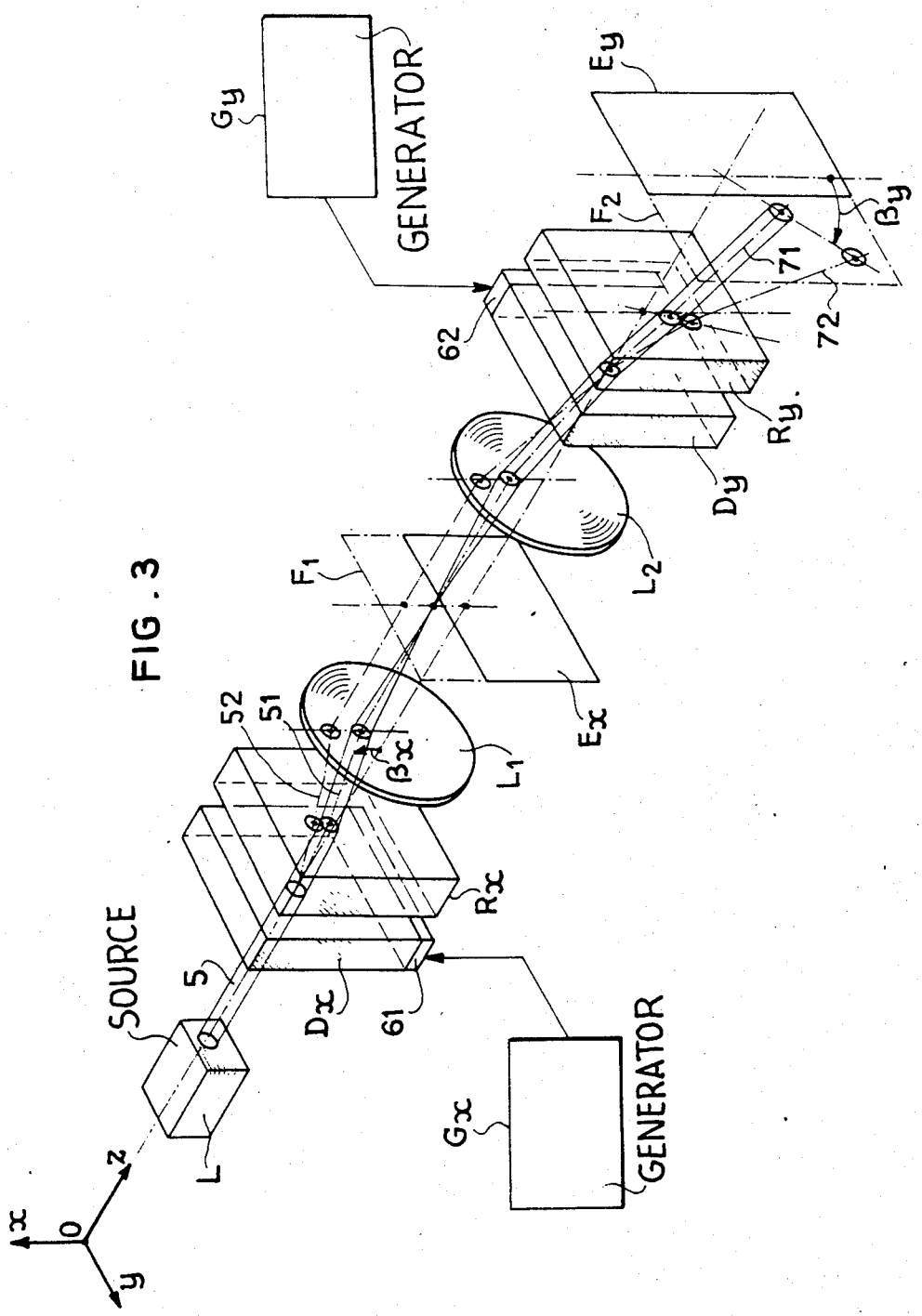
FIG. 3 shows an embodiment of the invention in which the beam deflection takes place in three dimensions.

FIG. 3 shows an embodiment of the system according to the invention in which beam deflection takes place in three dimensions. In that figure, the various optical elements are aligned along an axis O$z$. Located on this axis, in series, are the source L emitting a beam of radiated energy 5, an electro-optical deviator D$x$, analogous to the deviator D in previous figures, and causing a deviation of the beam 5 by an angle $\beta_x$ in the direction of an axis O$x$, a set of diffraction gratings, shown schematically by the assembly $R_x$ and analogous to the gratings $R_1 \ldots R_N$ of FIG. 1; a second electro-optical deviator D$y$, causing a deviation $\beta y$ of the incident beam in the direction of an axis O$y$, i.e., with respect to the plane $xOz$, and an assembly $R_y$ of diffraction gratings, for amplifying the preceding angular deviation.

In analogy to the embodiment of FIG. 1, the deviators $Dx$ and $Dy$ may be acousto-optical deviators, each excited by a generator, $Gx$ and $Gy$ respectively, through the intermediate action of a transducer, respectively labeled 61 and 62. By way of example, two directions of deviation have been shown in the direction of $Ox$ and the corresponding beams emerging from the set of gratings $Rx$ have been labeled 51 and 52, whereas only a single direction of deviation in the direction of $Oy$ is given for each of the beams 51 and 52 and these are labeled 71 and 72 at the output of the set of gratings Ry.

The system shown in FIG. 3 also includes a lens assembly for guiding the beams 51 and 52 toward the deviator $Dy$; it consists, for example, of two converging lenses $L_1$ and $L_2$ lying on the same axis ($Oz$) and having the same focal length and a common focal plane $F_1$. Such a system permits deflecting the beams 51 and 52 approximately toward the axis $Oz$ in the deflector $Dy$. After amplification of the angular deviation in the grating assembly $Rx$, the beams 51 and 52 cannot be converged onto the axis $Oz$ very precisely, but this is not important since the deviator $Dy$ makes an angular selection only in the direction $Oy$ and beams 51 and 52 always lie in the plane $xOz$ before they pass through the deflector $Dy$.

The system depicted in FIG. 3 also includes an opaque screen $Ex$ disposed essentially perpendicular to the axis $Oz$ and at some point between $Rx$ and $Dy$, for example along the plane $F_1$. The dimensions of this screen $Ex$ are so chosen that it stops the light which is not diffracted by the set of gratings $R_x$, as has been mentioned above. In analogous fashion, a second opaque screen $E_y$ is placed after the gratings $R_y$ so as to stop the light which is not diffracted by the set of gratings $R_y$.

As has also been mentioned herebefore, the deviators $D$, $D_x$ and $D_y$ may be, quite generally, of any kind of known electro-optical deviator.

A further embodiment, not shown in the figures, comprises a commutator and a birefringent element. The commutator can be a known electrically controlled element and permits switching the direction of polarization of the incident beam in two orthogonal directions; the birefringent element which is placed behind this commutator is such that the two directions of polarization given by the commutator correspond to the two different axes of propogation within the birefringent element. This assembly therefore constitutes a two-directional digital deflector.

Another advantageous embodiment provides a deviator made of an electro-optical material whose index of refraction can be changed by an electrid field; for example, by forming the electro-optic material into a prism, one can make the direction of the emerging lightbeam depend on the value of the applied electric field.

Figure 4:
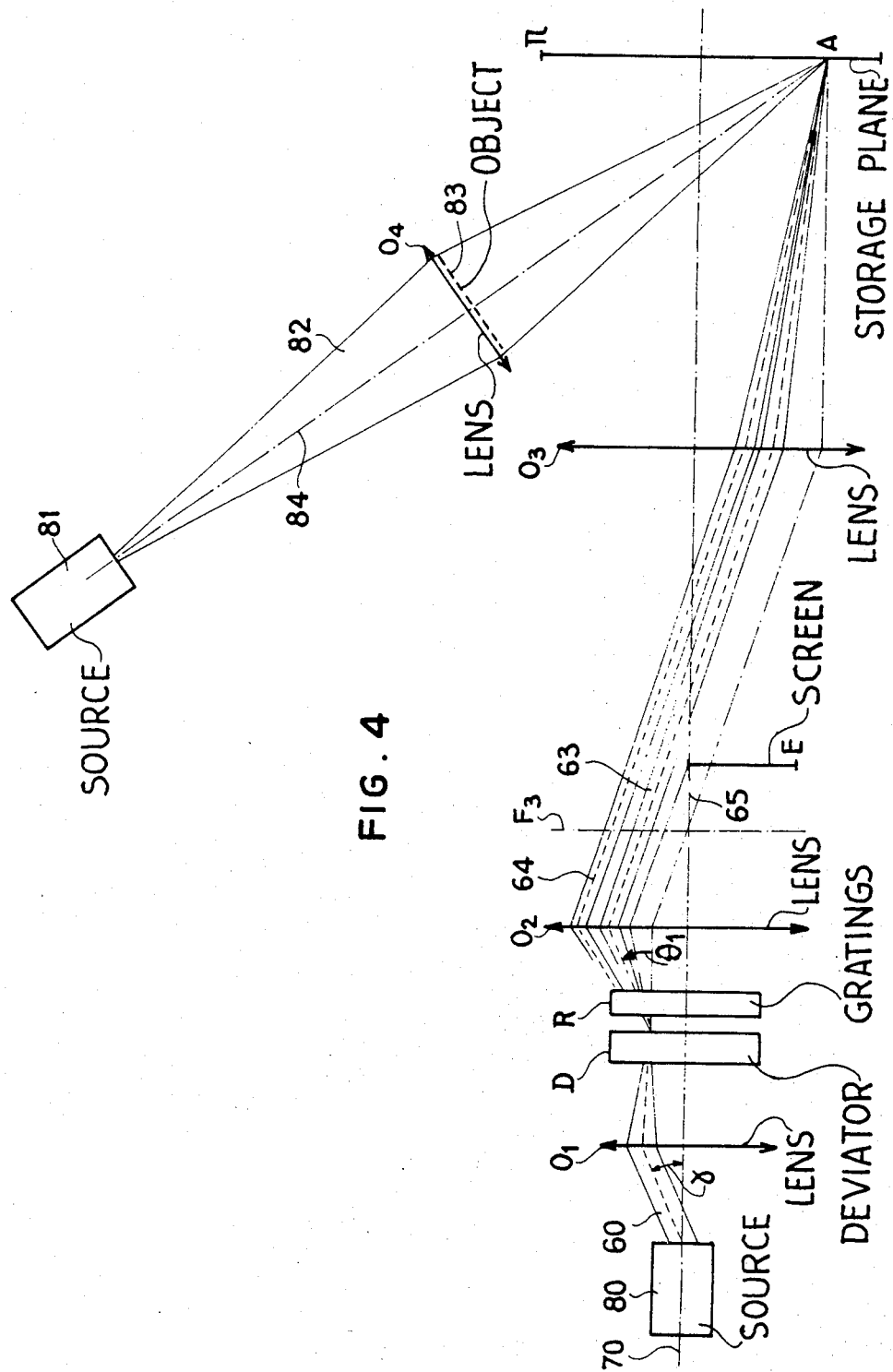
FIG. 4 illustrates the application of the deflection system according to the invention to a holographic memory.

FIG. 4 is a schematic representation of an apparatus in which the deflection system according to the invention is used for addressing a holographic memory.

This apparatus comprises a first optical axis 70, on which are placed, in series, a source 80; a first objective lens $O_1$; an electric optical deviator D; the set of diffraction gratings R; a second objective lens $O_2$, of the same focal length as lens $O_1$; a third objective lens $O_3$, preferably with a focal length very much greater than that of lenses $O_1$ and $O_2$, and a plane surface $\pi$, essentially orthogonal to the axis 70. The source 80 emits a parallel and coherent beam of energy 60 making an angle $\gamma$ with the axis 70; for example, the source 80 may be a laser which is combined with a deflector producing the deflection $\gamma$. The lens $O_1$ converges the beam 60 onto the deviator D; it should be noted, however, that the geometric point of convergence is, in reality, the center of a diffraction spot. The figure is not drawn to scale and the relative dimensions of the beam 60 and the deviator D are not necessarily the actual dimensions. As shown herein before the elements D and R deflect the incident beam 60 by an angle $\theta$; FIG. 4 shows the deflected beams 63 and 64. The apparatus includes an opaque screen E, analogous to the screens $E_x$ and $E_y$ in FIG. 3, which stops the undiffracted light 65. Objective lenses $O_2$ and $O_3$ with the common focal plane $F_3$ are so placed that they focus the beam 63 or 64 at a point A whose position on the plane $\pi$ is a function of the angle $\gamma$ given to the beam 60 by the element S. The point A is also the center of a diffraction spot.

The apparatus according to FIG. 4 includes a second optical axis 84, on which are placed, in series, a source 81 emitting a coherent beam 82 of radiant energy which is focussed by the lens $O_4$ on the plane $\pi$ at the point A; in practice, the source 81 may be the laser also constituting the source 80. Placed next to the objective lens $O_4$ is a modulator plane 83 containing information to be recorded.

It will be recalled that the recording of information by the holographic technique consists of illuminating a photosensitive plate simultaneously with two coherent light beams; one of the beams, called the object beam, illuminates a modulating object containing the information to be stored, and the other beam constitutes a reference beam. In the system of FIG. 4, the photosensitive plate lies in the plane $\pi$, the object beam is the beam 82, illuminating the object 83, and the reference beam is the beam 60.

Once developed, the photosensitive plate constitutes a hologram which, when illuminated by a so-called read-out beam, furnishes at least one image of the object 83; when this image is projected on a photo-detector, the registered information may be utilized in any desired manner.

To permit recording information at high density, the surface of the memory plane $\pi$ is usually divided into a certain number of zones or pages, each constituting a hologram of a well-defined modulator object.

In the system shown in FIG. 4, the point A is the center of a page whose surface area is approximately equal to the extent of the diffraction spot formed at this point; the selection of a given page is made by selecting the angle $\gamma$ of the beam 60. The storage capacity may be further increased by registering several superimposed holograms on a single page in the plane $\pi$; in that case, each hologram represents an individual object 83 and its location is characterized by a particular value of the angle which the reference beam 60 makes with the object beam 82 during the recording. During the readout, the reference beam must then be in the same angular position as during the recording. The apparatus shown in FIG. 4 permits the recording of multiple holograms on the same page, each record being characterized by the deflection angle imparted to the reference beam by the assembly DR. By comparison with other deviators, the assembly DR has the great advantage of making possible large deviation angles θ and, hence, permits recording a large number of holograms per page. This capability is especially useful when the superimposed recordings are made in a material of small thickness, i.e., a thickness of the order of a few millimeters.

For clarity of the representation, the deflections γ and θ have been shown in one and the same plane; it should be understood, however, that when the assembly DR is replaced by the 3-dimensional apparatus according to FIG. 3, the reference beam may be rotated about the point A in three dimensions.

What is claimed is:

1. Apparatus for deflecting an incident beam of radiated energy under the control of an incoming electrical signal, said apparatus comprising:
   a radiated energy beam deviator capable of deviating, under the control of said incoming electrical signal, said incident beam of radiated energy into a deviated beam having one of a plurality of first different angular directions; and
   a plurality of LIPPMANN-BRAGG holographic diffraction gratings disposed and located so as to successively intercept said deviated beam arriving from said beam deviator, one of said gratings causing a diffraction of said deviated beam having one of said first different angular directions into a largely deviated output beam having one of a plurality of second different larger angular directions, the other of said gratings merely transmitting said deviated beam having said one direction, and each of said gratings corresponding to one of said first angular directions and to one of said second angular directions; whereby the value of the angular deflection of the beam is increased.

2. An apparatus as defined in claim 1, wherein the surfaces of the diffraction gratings in said plurality of diffraction gratings are mutually parallel.

3. An apparatus as defined in claim 1, wherein the individual diffraction gratings in said plurality of diffraction gratings all have the same index of refraction, and wherein said plurality of diffraction gratings is immersed in a medium having the same index of refraction as said diffraction gratings.

4. An apparatus as defined in claim 1, wherein said plurality of diffraction gratings is contained within the same single material.

5. An apparatus for deflecting an incident beam of radiated energy under the control of a first and a second incoming electrical signals, said apparatus comprising:
   a first radiated energy beam deviator capable of deviating, under the control of said first incoming electrical signal, said incident beam of radiated energy into a first deviated beam having one of a plurality of first different angular directions lying in a first deviation plane;
   a plurality of first LIPPMANN-BRAGG holographic diffraction gratings disposed and located so as to successively intercept said first deviated beam arriving from said first beam deviator, one of said first gratings causing a diffraction of said first deviated beam having one of said first different angular directions into a largely deviated second beam having one of a plurality of second different angular directions lying in said first plane, the other of said first gratings merely transmitting said first deviated beam having said one of said first directions, and each of said first gratings corresponding to one of said first angular directions and to one of said second angular directions;
   a second radiated energy beam deviator, positioned for receiving from said first diffraction gratings said second beam, and capable of deviating, under the control of said second incoming electrical signal, said second beam into a third deviated beam having one of a plurality of third different angular directions lying in a second deviation plane at an angle with said first deviation plane; and
   a plurality of second LIPPMANN-BRAGG holographic gratings, disposed and located so as to successively intercept said third deviated beam arriving from said second beam deviator, one of said second gratings causing a diffraction of said third deviated beam having one of said third different angular directions into a largely deviated fourth beam having one of a plurality of fourth different larger angular directions lying in said second plane, the other of said second gratings merely transmitting said third deviated beam having said one of said third directions, and each of said second gratings corresponding to one of said third angular directions and to one of said fourth angular directions.

6. An apparatus as defined in claim 5, wherein said first beam deviator and said second beam deviator are acousto-optical beam deviators.

7. An apparatus as defined in claim 1, wherein said beam deviator is an acousto-optical beam deviator.

8. An apparatus for storing information data, which comprises:
   means for providing, under the control of an incoming electrical data signal, an incident beam of radiated energy;
   a first radiated energy beam deviator capable of deviating, under the control of a first incoming electrical signal, said incident beam of radiated energy into a first deviated beam having one of a plurality of first different angular directions lying in a first geometric plane;
   a plurality of first LIPPMANN-BRAGG holographic diffraction gratings disposed and located so as to successively intercept said first deviated beam arriving from said first beam deviator, one of said first gratings causing a diffraction of said first deviated beam having one of said first different angular directions into a largely deviated second beam having one of a plurality of second different angular directions lying in said first plane, the other of said first gratings merely transmitting said first deviated beam having said one of said first directions, and each of said gratings corresponding to one of said first angular directions and to one of said second angular directions;
   a second radiated energy beam deviator, positioned for receiving from said first diffraction gratings said second beam, and capable of deviating, under the control of a second incoming electrical signal, said second beam into a third deviated beam having one of a plurality of third different angular directions lying in a second deviation plane at an angle with said first deviation plane; and
   a plurality of second LIPPMANN-BRAGG holographic gratings, disposed and located so as to successively intercept said third deviated beam arriving from said second beam deviator, one of said second gratings causing a diffraction of said third deviated beam having one of said third different angular directions into a largely deviated fourth beam having one of a plurality of fourth different larger directions lying in said second plane, the other of said second gratings merely transmitting said third deviated beam having said one of said third directions, and each of said second gratings corresponding to one of said third angular directions and to one of said fourth angular directions; information storage means, disposed to intercept said fourth beam; whereby said fourth beam writes said information data in said information storage means.

* * * * *